United States Patent
Ko

(10) Patent No.: US 8,754,474 B2
(45) Date of Patent: Jun. 17, 2014

(54) LDMOS SEMICONDUCTOR DEVICE HAVING GUARDRING REGION DISPOSED AT SIDE OF WELL REGION

(75) Inventor: Choul Joo Ko, Seongnam-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 438 days.

(21) Appl. No.: 13/089,005

(22) Filed: Apr. 18, 2011

(65) Prior Publication Data

US 2012/0126322 A1 May 24, 2012

(30) Foreign Application Priority Data

Nov. 23, 2010 (KR) .................. 10-2010-0116671

(51) Int. Cl.
*H01L 29/66* (2006.01)
(52) U.S. Cl.
USPC ........................ 257/335; 257/355; 257/339
(58) Field of Classification Search
USPC .................................. 257/335, 339, E29.256
See application file for complete search history.

(56) References Cited

U.S. PATENT DOCUMENTS

| | | | | |
|---|---|---|---|---|
| 5,495,122 A * | 2/1996 | Tada | | 257/392 |
| 5,556,796 A * | 9/1996 | Garnett et al. | | 438/294 |
| 6,150,701 A * | 11/2000 | Lee | | 257/409 |
| 6,306,700 B1 * | 10/2001 | Yang | | 438/217 |
| 6,747,294 B1 * | 6/2004 | Gupta et al. | | 257/127 |
| 6,756,270 B2 * | 6/2004 | Lee | | 438/258 |
| 7,019,377 B2 * | 3/2006 | Tsuchiko | | 257/476 |
| 7,759,759 B2 * | 7/2010 | Tsuchiko | | 257/471 |
| 7,808,069 B2 * | 10/2010 | Ho et al. | | 257/484 |
| 8,227,871 B2 * | 7/2012 | Ko | | 257/370 |
| 8,344,416 B2 * | 1/2013 | Sheu et al. | | 257/170 |
| 2005/0073007 A1 * | 4/2005 | Chen et al. | | 257/355 |
| 2007/0045767 A1 * | 3/2007 | Zhu et al. | | 257/505 |
| 2007/0138592 A1 * | 6/2007 | Chang et al. | | 257/500 |

FOREIGN PATENT DOCUMENTS

| KR | 1020100064262 | 6/2010 |
|---|---|---|
| KR | 1020100079705 | 7/2010 |

\* cited by examiner

*Primary Examiner* — Bilkis Jahan
(74) *Attorney, Agent, or Firm* — Sherr & Jiang, PLLC

(57) ABSTRACT

A Lateral Double Diffused Metal-Oxide-Semiconductor (LDMOS) semiconductor device includes a substrate; a gate region, a source region, and a drain region on and/or over the substrate, a well region at one side of the drain region, and a guardring region disposed at one side of the well region and connected electrically to the well region.

15 Claims, 3 Drawing Sheets

LDMOS SEMICONDUCTOR DEVICE HAVING GUARDRING REGION DISPOSED AT SIDE OF WELL REGION

CROSS-REFERENCE TO RELATED APPLICATIONS

This application claims priority under 35 U.S.C. §119 to Korean Patent Application No. 10-2010-0116671, filed Nov. 23, 2010, which is hereby incorporated by reference in its entirety.

BACKGROUND

Embodiments are related generally to a Lateral Double Diffused Metal-Oxide-Semiconductor (LDMOS) semiconductor device.

Since a related art power Metal-Oxide-Semiconductor Field-Effect Transistor (MOSFET) has high input impedance compared to a bipolar transistor, power gain is high and a gate drive circuit is simple. Additionally, since the related art power MOSFET is a unipolar device, there is no time delay occurring due to accumulation or recombination by minority carriers during turn-off.

Accordingly, as a current trend, the related art power MOSFET is gradually and extensively applied to a switching mode power supply unit and a lamp stabilization and motor drive circuit.

The related art power MOSFET generally has Doubled Diffused MOSFET (DMOS) structure using a planar diffusion technique and its representative one is a Lateral Double Diffused Metal-Oxide-Semiconductor (LDMOS).

In a case of the LDMOS, when a drain has lower electric potential than a substrate at a low side, a P-N junction operates in a forward direction. Consequently, noise occurs.

In order to remove the noise, the LDMOS includes a single-type or double-type deep well guardring and a floating-type structure.

In a case of the single-type guardring, however, it is insufficient to completely block electrons. Moreover, in a case of a double-type guardring, the ability of collecting electrons is excellent but a chip size is greatly increased.

In a case of the floating type structure, when medium current is injected, it effectively collects electrons. When high current is injected, however, the ability of collecting electrons is drastically deteriorated.

SUMMARY

In accordance with embodiments, an LDMOS semiconductor device is provided and structurally configured to effectively prevent the occurrence of noise.

In accordance with embodiments, an LDMOS semiconductor device includes at least one of the following: a substrate; a gate region, a source region, and a drain region on and/or over the substrate; a well region at one side of the drain region; and a guardring region disposed at one side of the well region and connected electrically to the well region.

In accordance with embodiments, an LDMOS semiconductor device includes at least one of the following: a substrate; a source region at one side of the gate region; a drain region at the other side of the gate region; and a guardring region including a P-well at one side of the drain region and a guardring provided at least at one side of the P-well.

DRAWINGS

Figure 1:
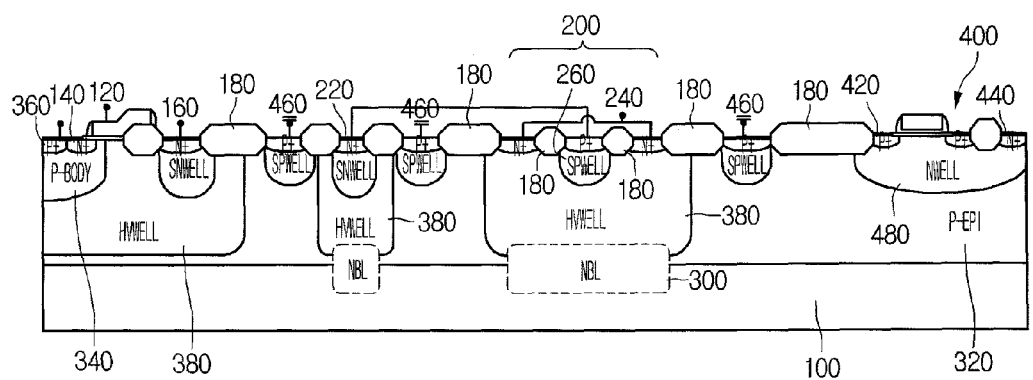

Example FIG. 1 is a sectional view illustrating an LDMOS semiconductor device with a guardring in accordance with embodiments.

Figure 2:
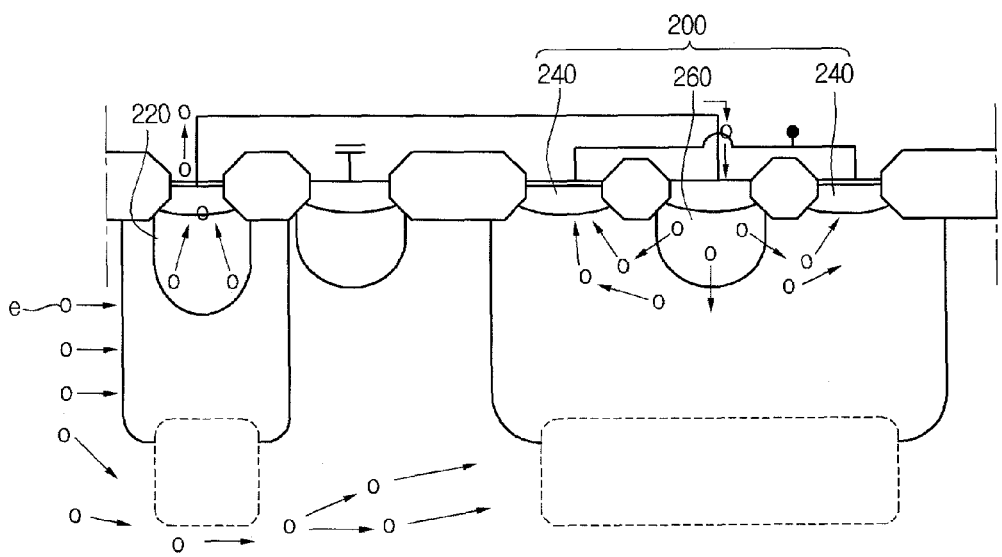

Example FIG. 2 is a schematic view illustrating electron mobility of the LDMOS semiconductor device in accordance with embodiments.

Figure 3:
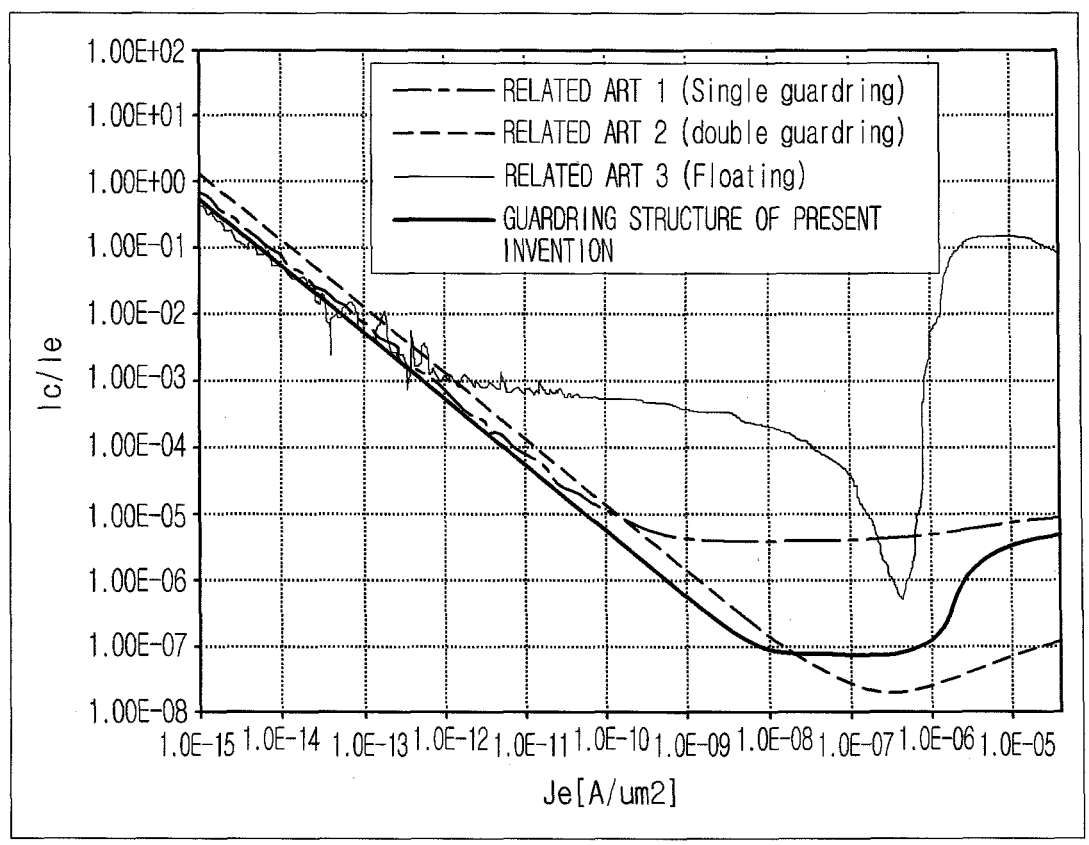

Example FIG. 3 is a graph illustrating a current gain of the LDMOS semiconductor device in accordance with embodiments.

Figure 4:
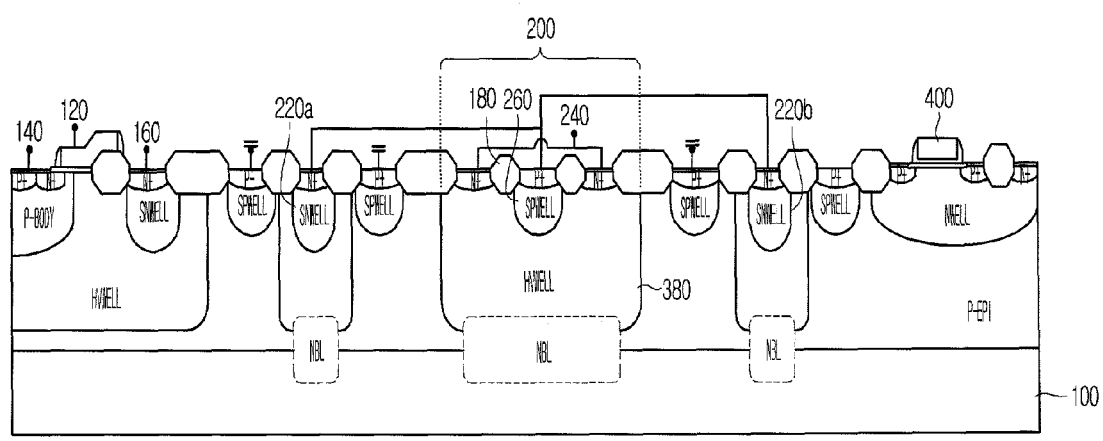

Example FIG. 4 is a sectional view illustrating an LDMOS semiconductor device with a guardring in accordance with embodiments.

Figure 5:
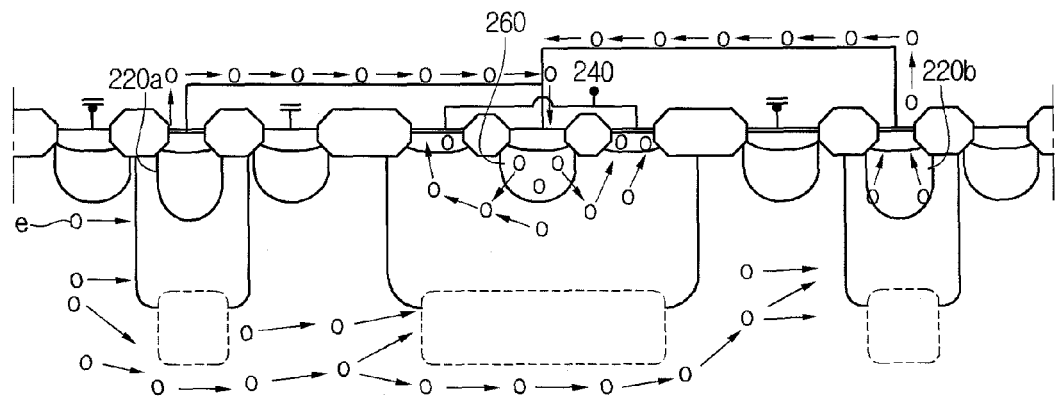

Example FIG. 5 is a schematic view illustrating electron mobility of the LDMOS semiconductor device in accordance with embodiments.

DESCRIPTION

Hereinafter, an LDMOS semiconductor device in accordance with embodiments will be described with reference to the accompanying drawings.

In the description of embodiments, it will be understood that when a layer (or film) is referred to as being "on" another layer or substrate, it can be directly on another layer or substrate, or intervening layers may also be present. Further, it will be understood that when a layer is referred to as being "under" another layer, it can be directly under another layer, and one or more intervening layers may also be present. In addition, it will also be understood that when a layer is referred to as being "between" two layers, it can be the only layer between the two layers, or one or more intervening layers may also be present.

Any reference herein "embodiments," "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Example FIG. 1 is a sectional view illustrating an LDMOS semiconductor device with a guardring in accordance with embodiments. Example FIG. 2 is a schematic view illustrating electron mobility of the LDMOS semiconductor device in accordance with embodiments. Example FIG. 3 is a graph illustrating a current gain of the LDMOS semiconductor device in accordance with embodiments. Example FIG. 4 is a sectional view illustrating an LDMOS semiconductor device with a guardring in accordance with embodiments. Example FIG. 5 is a schematic view illustrating electron mobility of the LDMOS semiconductor device in accordance with embodiments.

As illustrated in example FIG. 1, the LDMOS semiconductor device in accordance with embodiments includes substrate 100, gate 120 on and/or over substrate 100, source region 140, drain region 160, well region 220 at one side of drain region 160, and guardring region 200 disposed at one side of well region 220 and electrically connected to well region 220. Substrate 100 is a wafer doped with a P-type dopant and includes N-buried layer (NBL) 300 and P-epitaxial layer (P-EPI) 320.

When voltage is applied to drain region 160, NBL 300 reduces the width of a depletion layer extending from P-BODY 340, thereby substantially raising a punch through voltage.

Gate 120, N-source region 140, N-drain region 160 are formed at one side of substrate 100. Gate 120 is formed to partially overlap device isolation layer 180 on and/or over substrate 100. Source region 140 is formed at one side of gate 120. Source region 140 is included in P-BODY 340 and may further include impurity layer 360 doped with a P-type dopant to have adequate contact with P-BODY 340. Drain region 160 is formed at the other side of gate region 120 and drain region 160 may be formed with a structure where an N-type dopant is implanted into a shallow N-well (SNWELL). Drain region 160 is surrounded by N-high voltage (HV)-well 380.

Low-voltage (LV) device 400 is formed at the other side on and/or over substrate 100 and may be formed being surrounded by an N-WELL. N-well region 220 and guardring region 200 are sequentially and adjacently formed between LV device 400 and the drain region 160. N-well region 220 is electrically connected to guardring region 200. Guardring region 200 may include P-well region 260 and guardrings 240 at both sides of P-well region 260. P-wells 460 grounded to substrate 100 may be further formed at both sides of N-well region 220 and guardring region 200. In such a structure, N-well region 220 and guardring region 200 may sufficiently absorb electrons emitted from drain region 160 and the electrons flow into LV device 400 so that the occurrence of noise can be prevented.

N-well region 220 has a structure where an N-type dopant is formed in a shallow N-well (SN-WELL) and the SN-WELL is surrounded by HV-WELL 380. P-well region 260 has a structure where a P-type dopant is implanted in the SP-WELL. P-well region 260 is electrically connected to N-well region 220. From this, electrons absorbed in N-well region 220 may transfer to P-well region 260. Guardrings 240 are formed at both sides of P-well region 260. Guardring 240 has a structure where an N-type dopant is implanted and is formed adjacent to P-well region 260 and device isolation layer 180. P-well region 260 and guardring 240 are surrounded by HV-WELL 380. Guardring 240 absorbs electrons emitted from drain region 160 and also absorbs electrons emitted from P-well region 260 simultaneously to prevent electrons from flowing into LV device 400.

In more detail, as illustrated in Example FIG. 2, some electrons e emitted from the drain region flow into N-well region 220 and the remaining electrons e pass through N-well region 220. The electrons flowing into N-well region 220 transfer into guardring region 200, i.e., P-well region 260, and then are emitted from P-well region 260.

As mentioned hereinabove, the electrons e emitted from P-well region 260 are re-absorbed in guardrings 240 at both sides of P-well region 260 and the electrons e may not escape from guardring region 200. On the other hand, the electrons e that are not absorbed in N-well region 220, and thus, pass through N-well region 220 are sufficiently absorbed in guardring region 220 at one side of N-well region 220, so that they may not escape from guardring region 200. Since the electrons e emitted from the drain region has a dual electron absorbing structure, absorption efficiency of the electrons e is excellent and more effects may be achieved without a guardring of a related art deep structure.

As illustrated in example FIG. 3, looking at the current gain Hfe of a parasite NPN according to lc/le of the LDMOS semiconductor device with a guardring structure, the LDMOS semiconductor in accordance with embodiments has advantageous effects when compared to the related art single guardring structure (the related art 1) and the floating-type structure (the related art 3) but has a similar tendency to the related art dual guardring structure (the related art 2).

Since the related art dual guardring structure (the related art 2) occupies a greatly broad area of an LDMOS semiconductor device, however, the LDMOS semiconductor device in accordance with embodiments has a reduced size in comparison to the related art LDMOS semiconductor device having a dual guardring structure.

Although it is illustrated that the guardrings in accordance with embodiments are formed at both sides of the P-well region, embodiments are not limited thereto and it is apparent that at least two guardrings may be formed at least one side or both sides. In accordance with embodiments, although it is illustrated that one N-well region and one guardring region are formed, embodiments are not limited thereto, and thus, may be configured as follows.

As illustrated in example FIG. 4, in accordance with embodiments, an LDMOS semiconductor device with a guardring includes substrate 100, gate 120 at one side on and/or over substrate 100, source region 140, drain region 160, LV device 400 at the other side on and/or over substrate 100, guardring region 200 between drain region 160 and LV device 400, and N-well region 220 connected electrically to both sides of guardring region 200. Gate 120, source region 140, drain region 160, and LV device 400 are identical to those in the above embodiment so that their descriptions will be omitted.

Guardring region 200 includes P-well region 260 into which a P-type dopant is implanted and guardrings 240 at both sides of P-well region 260. Guardring 240 are formed by implanting an N-type dopant and guardring 240 and P-well region 260 are separated by device isolation layer 180. In accordance with embodiments, the number of guardrings 240 is not limited and may be more than 3. P-well region 260 and guardring 240 are surrounded by HV-WELL 380. N-well regions 220a, 220b are disposed at one side and the other side of guardring region 200 and are electrically connected to P-well region 260 of guardring region 200. Each N-well region 220a, 220b has a structure where an N-type dopant is implanted on and/or over a shallow N-well and the shallow N-well is surrounded by HV-WELL 380. In accordance with embodiments, although it is illustrated that each N-well region 220a, 220b is electrically connected using one line, it is not limited thereto, and thus, an additional line can be electrically connected.

As illustrated in example FIG. 5, some electrons e emitted from the drain region are absorbed in first N-well region 220a and the remaining electrons e are not absorbed in but pass through first N-well region 220a. The electrons e absorbed in N-well region 220a transfer into guardring region 200, e.g., P-well region 260, and the electrons e emitted from P-well region 260 are re-absorbed in guardrings 240 at both sides of P-well region 260.

On the other hand, the electrons e that are not absorbed in first N-well region 220a pass through first N-well region 220a and are absorbed in guardring region 220. The remaining few electrons e that are not absorbed in guardring region 220 are absorbed in second N-well region 220b. The electrons e absorbed in second N-well region 220b transfer into P-well region 260 of guardring region 200 and the electrons e emitted from P-well region 260 are re-absorbed in guardrings 240 at both sides of P-well region 260. Such a structure may completely block the electrons e emitted from the drain region. Consequently, the noise blocking effect of the LDMOS semiconductor device may be maximized.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A Lateral Diffused Metal-Oxide-Semiconductor (LDMOS) device comprising:
    a substrate;
    a gate region over the substrate;
    a source region and a drain region which are formed in the substrate;
    an N-well region formed in the substrate and spaced apart from the drain region;
    a guardring region connected electrically to the N-well region, wherein the N-well region is located between the drain region and the guardring region; and
    a plurality of second P-well regions grounded to the substrate and disposed at both sides of the N-well region and both sides of the guardring region.

2. The LDMOS semiconductor device of claim 1, wherein the N-well region comprises:
    a shallow N-well region doped with an N-type dopant; and
    an N+-type region in the shallow N-well region.

3. The LDMOS semiconductor device of claim 1, further comprising:
    a second HV-WELL formed in the substrate and under the gate region, wherein the drain region and the source region are formed in the second HV-WELL.

4. The LDMOS semiconductor device of claim 1, wherein the guardring region comprises:
    a first P-well region in the substrate and connected electrically to the N-well region by a line; and
    at least one guardring disposed at least at one side of the first P-well region.

5. The LDMOS semiconductor device of claim 4, further comprising:
    at least one device isolation layer formed between the first P-well region and the at least one guardring.

6. The LDMOS semiconductor device of claim 4, further comprising:
    a first High Voltage (HV)-WELL in the substrate, wherein the guardring region is formed in the first HV-WELL.

7. The LDMOS semiconductor device of claim 6, further comprising:
    a buried layer in the substrate and under the first HV-WELL.

8. The LDMOS semiconductor device of claim 4, wherein the at least one guardring includes first and second guardrings each disposed at one side of the first P-well region and doped with an N-type dopant.

9. The semiconductor device of claim 8, further comprising:
    a first device isolation layer formed between the first P-well region and the first guardring; and
    a second device isolation layer formed between the first P-well region and the second guardring.

10. A LDMOS semiconductor device comprising:
    a substrate;
    a source region at one side of a gate region;
    a drain region at another side of the gate region different than the one side;
    at least one N-well region formed in the substrate spaced apart from the drain region;
    at least one guardring electrically connected to the at least one N-well region, wherein the at least one N-well region is located between the drain region and the at least one guardring region, wherein the drain region is disposed between the gate region and the gaurdring region; and
    a plurality of second P-well regions grounded to the substrate and disposed at both sides of the at least one N-well region and both sides of the at least one quardring region.

11. The LDMOS semiconductor device of claim 10, wherein the at least one N-well region comprises:
    a shallow N-well region doped with an N-type dopant; and
    an N+-type region in the shallow N-well region.

12. The LDMOS semiconductor device of claim 10, wherein the at least one N-well region is connected to the guardring region through at least one line.

13. The semiconductor device of claim 10, wherein the at least one guardring includes first and second guardrings disposed at both sides of the P-well region.

14. The semiconductor device of claim 13, further comprising:
    a first device isolation layer formed between the P-well region and the first guardring; and
    a second device isolation layer formed between the P-well region and the second guardring.

15. A semiconductor device comprising:
    a substrate;
    a source region and a drain region which are formed in the substrate;
    a gate region over the substrate;
    at least one N-well region formed in the substrate spaced apart from the source region and the drain region;
    a guardring region electrically connected to the at least one N-well region and spaced apart from the at least one N-well region; and
    a plurality of second P-well regions grounded to the substrate and disposed at both sides of the at least one N-well region and both sides of the guardring region.

* * * * *